United States Patent
Daigo

(10) Patent No.: US 11,482,416 B2
(45) Date of Patent: Oct. 25, 2022

(54) VAPOR PHASE GROWTH METHOD

(71) Applicant: NuFlare Technology, Inc., Yokohama (JP)

(72) Inventor: Yoshiaki Daigo, Yokohama (JP)

(73) Assignee: NuFlare Technology, Inc., Kanagawa (JP)

( * ) Notice: Subject to any disclaimer, the term of this patent is extended or adjusted under 35 U.S.C. 154(b) by 224 days.

(21) Appl. No.: 16/788,761

(22) Filed: Feb. 12, 2020

(65) Prior Publication Data

US 2020/0185220 A1 Jun. 11, 2020

Related U.S. Application Data

(63) Continuation of application No. PCT/JP2018/029361, filed on Aug. 6, 2018.

(30) Foreign Application Priority Data

Aug. 30, 2017 (JP) .............................. JP2017-165423

(51) Int. Cl.
H01L 21/02 (2006.01)
C30B 25/08 (2006.01)
C30B 25/16 (2006.01)
H01L 21/67 (2006.01)

(52) U.S. Cl.
CPC ........ H01L 21/02636 (2013.01); C30B 25/08 (2013.01); C30B 25/165 (2013.01); H01L 21/02529 (2013.01); H01L 21/67248 (2013.01)

(58) Field of Classification Search
CPC ....... H01L 21/02636; H01L 21/025229; H01L 21/67248; C30B 25/08; C30B 25/165
See application file for complete search history.

(56) References Cited

U.S. PATENT DOCUMENTS

| 2012/0028445 A1 | 2/2012 | Suzuki et al. |
| 2012/0214317 A1 | 8/2012 | Murobayashi et al. |
| 2012/0244684 A1 | 9/2012 | Suzuki et al. |

(Continued)

FOREIGN PATENT DOCUMENTS

| JP | 2000-150394 A | 5/2000 |
| JP | 2009-164162 A | 7/2009 |
| JP | 2012-33775 A | 2/2012 |

(Continued)

OTHER PUBLICATIONS

Japanese Office Action (JPOA) dated Jun. 15, 2021 issued in the corresponding Japanese Patent Application No. 2017-165423 and its English machine translation.

(Continued)

*Primary Examiner* — Dale E Page
*Assistant Examiner* — Quovaunda Jefferson
(74) *Attorney, Agent, or Firm* — Rankin, Hill & Clark LLP

(57) ABSTRACT

A substrate is mounted on a rotator provided in a reaction chamber, while a first process gas containing no source gas is supplied to an upper surface of the substrate from above the substrate and the substrate is rotated at 300 rpm or more, a temperature of a wall surface is changed, and after a temperature of the substrate is allowed to rise, the substrate is controlled to a predetermined film formation temperature and a second process gas containing a source gas is supplied to the upper surface of the substrate from above the substrate to grow an SiC film on the substrate.

10 Claims, 4 Drawing Sheets

(56) References Cited

U.S. PATENT DOCUMENTS

2014/0287539 A1    9/2014   Ito et al.

FOREIGN PATENT DOCUMENTS

| JP | 2012-174782 A | 9/2012 |
| JP | 2013-128086 A | 6/2013 |
| JP | 2014-187282 A | 10/2014 |
| JP | 2015-32630 A | 2/2015 |
| JP | 2015-119107 A | 6/2015 |

OTHER PUBLICATIONS

Extended European Search Report dated Jun. 2, 2021 issued in the corresponding European Patent Application No. 18851839.3.
Japanese Office Action dated Mar. 30, 2021 issued in the corresponding Japanese Patent Application No. 2017-165423 and its English machine translation.
International Search Report (ISR) issued in PCT/JP2018/029361 dated Sep. 4, 2018.
Taiwanese Office Action issued in corresponding Taiwanese patent application No. 107130094 dated May 2, 2019 and its English machine translation.

VAPOR PHASE GROWTH METHOD

CROSS-REFERENCE TO RELATED APPLICATION

This application is based upon and claims the benefit of priority from Japanese Patent Application No. 2017-165423, filed on Aug. 30, 2017, the entire contents of which are incorporated herein by reference.

FIELD OF THE INVENTION

Embodiments described herein relate generally to a vapor phase growth method.

BACKGROUND OF THE INVENTION

Silicon carbide (SiC) is expected as a material for next-generation semiconductor devices. As compared with silicon (Si), SiC has excellent physical properties such as a band gap of 3 times, a breakdown electric field strength of about 10 times, and a thermal conductivity of about 3 times. By using these properties, it is possible to realize a semiconductor device capable of operating at high temperature with low loss.

In a growth process of an SiC epitaxial growth film using chemical vapor deposition (CVD), SiC is deposited on a high temperature portion, particularly on a hot wall, in a path from a gas supplier to an SiC substrate in a reaction chamber. The deposited SiC is peeled off to be downfalls (particles).

There is a problem in that the downfalls become device killer defects caused by falling onto the SiC substrate before or during the growth of the SiC epitaxial film, being embedded in the SiC epitaxial film, or generating triangular defects starting from the downfalls.

SUMMARY OF THE INVENTION

According to an embodiment of the invention, there is provided a vapor phase growth method including: mounting a substrate on a rotator provided in a reaction chamber; while supplying a first process gas containing no source gas to an upper surface of the substrate from above the substrate and rotating the substrate at 300 rpm or more, changing a temperature of a wall surface; and after allowing a temperature of the substrate to rise, controlling the substrate to a predetermined film formation temperature and supplying a second process gas containing a source gas to the upper surface of the substrate from above the substrate to grow an SiC film on the substrate.

In the vapor phase growth method of the above embodiment, it is preferable that, after the desired SiC film is grown on the substrate, the temperature of the substrate is allowed to drop, and while supplying the first process gas to the upper surface of the substrate from above the substrate and rotating the substrate at 300 rpm or more, the temperature of the wall surface is changed.

In the vapor phase growth method of the above embodiment, it is preferable that the temperature of the wall surface is changed by changing the first process gas from an inert gas to a hydrogen gas or from the hydrogen gas to the inert gas while rotating the substrate at 300 rpm or more.

In the vapor phase growth method of the above embodiment, it is preferable that the temperature of the wall surface is changed in a state where the temperature of the substrate is 1300° C. or less.

In the vapor phase growth method of the above embodiment, it is preferable that the rotator is rotated at 100 rpm or more in a state where the substrate is detached from the rotator.

DETAILED DESCRIPTION OF THE EMBODIMENTS

Hereinafter, embodiments of the invention will be described with reference to the drawings.

In this specification, the direction of gravity in a state where the vapor phase growth apparatus is installed so as to be capable of performing film formation is defined as "low", and the opposite direction is defined as "up". Therefore, "lower" denotes a position in the direction of gravity relative to a reference, and "below" denotes the direction of gravity relative to the reference. In addition, "upper" denotes a position in the direction opposite to the direction of gravity with respect to the reference, and "above" denotes the direction opposite to the direction of gravity with respect to the reference.

A vapor phase growth method according to an embodiment includes: mounting a substrate on a rotator provided in a reaction chamber; while supplying a first process gas containing no source gas to an upper surface of the substrate from above the substrate and rotating the substrate at 300 rpm or more, changing a temperature of a wall surface; and after allowing a temperature of the substrate to rise, controlling the substrate to a predetermined film formation temperature and supplying a second process gas containing a source gas to the upper surface of the substrate from above the substrate to grow an SiC film on the substrate.

Figure 1:
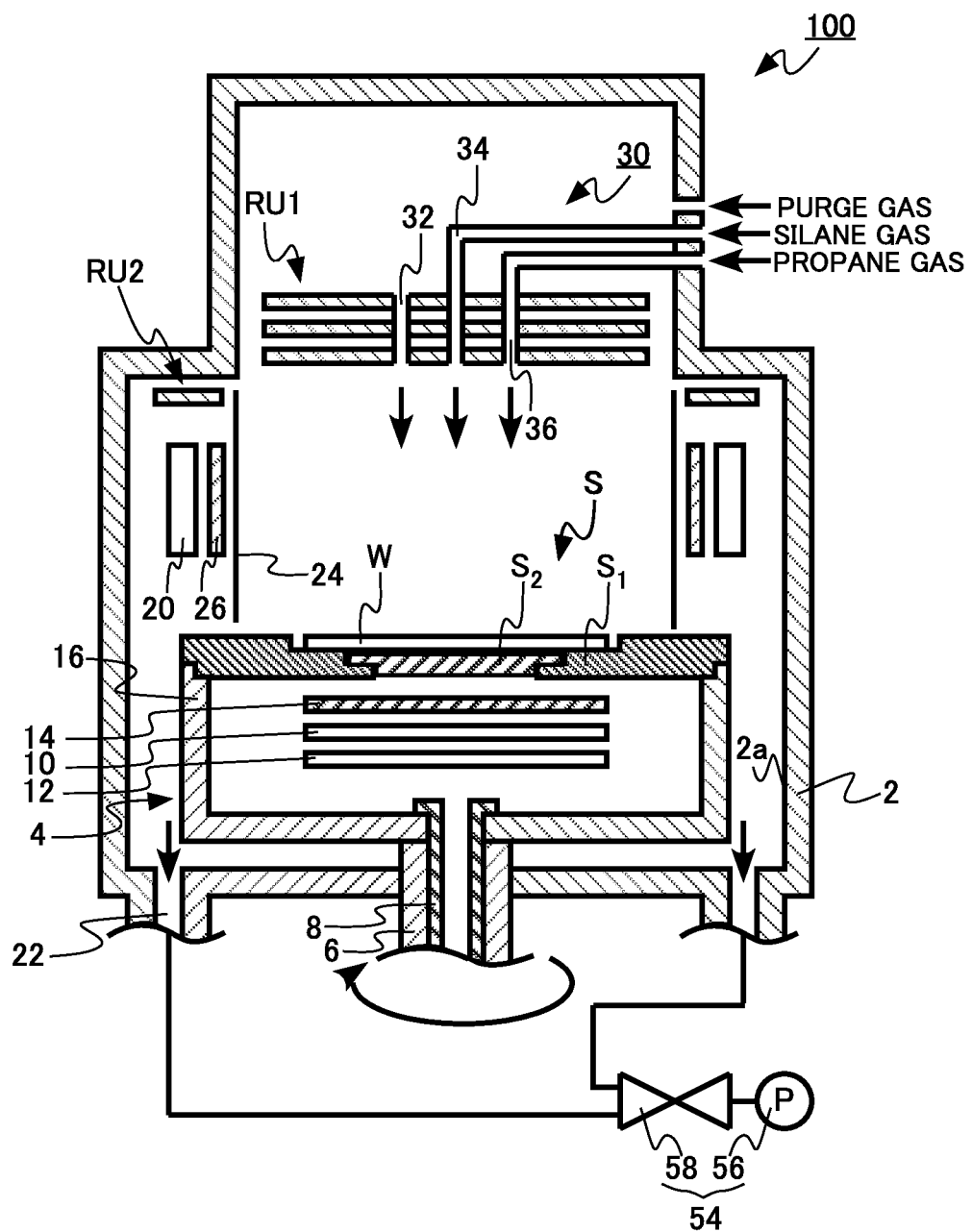
FIG. 1 is a schematic cross-sectional view of a vapor phase growth apparatus according to an embodiment.

FIG. 1 is a schematic cross-sectional view of a vapor phase growth apparatus 100 according to the embodiment. The vapor phase growth apparatus 100 in the embodiment is an epitaxial growth apparatus using a CVD method (chemical vapor deposition method). Hereinafter, a case where an SiC film is epitaxially grown on an SiC substrate W will be mainly described as an example.

The SiC substrate W is mounted on a susceptor S. Process gases are supplied to the SiC substrate W to cause a reaction on the substrate W to form a film. Herein, the process gases include an Si-based gas (for example, a monosilane ($SiH_4$) gas) and a C-based gas (for example, a propane ($C_3H_8$) gas) as an SiC source gas, a Cl-based gas (for example, a hydrogen chloride (HCl) gas) for promoting the growth of SiC, an argon (Ar) gas as a purge gas, a hydrogen ($H_2$) gas as a carrier gas, and the like. Incidentally, a gas containing Si atoms and Cl atoms, such as a dichlorosilane ($H_2SiCl_2$) gas or a trichlorosilane ($HSiCl_3$) can also be used as the Si-based gas.

The vapor phase growth apparatus 100 includes a reaction chamber 2 as a film formation chamber for forming an SiC epitaxial film on the substrate W.

The susceptor S is provided above a rotator 4. The susceptor S includes an outer peripheral susceptor $S_1$ having a ring shape configured with an opening and an inner susceptor $S_2$ provided to close the opening inside the outer peripheral susceptor $S_1$. A counterbore is provided on the inner peripheral side of the outer peripheral susceptor $S_1$. Further, a recess for receiving and supporting the outer peripheral portion of the substrate W is provided in the counterbore. As a material of the susceptor S, carbon, SiC, or TaC is preferably used. Alternatively, a material in which TaC is coated on the surface of carbon may be used. In addition, the structure of the recess in the susceptor S may be any of a structure obtained by processing a counterbore in the disk-shaped member, a structure obtained by mounting a ring-shaped member on the disk-shaped member, or a combination of the structures.

The rotator 4 has a susceptor holder 16 at the upper portion and a rotating shaft 6 at the lower portion. The susceptor holder 16 supports the susceptor S at the upper portion (susceptor mounting portion 16a in FIGS. 3A to 3L). The rotating shaft 6 is rotated by a motor (not illustrated), so that the susceptor holder 16 is rotated. The susceptor S rotates through the rotation of the susceptor holder 16. In this manner, the SiC substrate W mounted on the susceptor S can be rotated in the peripheral direction of the SiC substrate W.

The susceptor holder 16 has a structure in which the upper portion is opened. A first heater 14 is provided in the rotator 4. As the first heater 14, for example, a resistance heater made of a carbon (C) material is used. The first heater 14 is supplied with an electric power by an electrode (not illustrated) passing through the inside of a substantially cylindrical quartz shaft 8 provided inside the rotating shaft 6 and heats the SiC substrate W from the back surface of the SiC substrate W.

In addition, in the rotator 4, a reflector 10 is provided below the first heater 14 in order to efficiently perform heating by the first heater 14. The reflector 10 is made of a material having high heat resistance such as carbon, SiC, or carbon coated with SiC. In addition, a heat insulating material 12 is provided below the reflector 10. By providing the heat insulating material 12, it is possible to prevent heat from the first heater 14 from being transmitted to the shaft 8, the installation portion, and the like and to suppress the heater electric power during the heating.

In the lower portion of the reaction chamber 2, an exhaust unit 22 is provided for exhausting a gas containing surplus process gases and reaction byproducts. The exhaust unit 22 is connected to an exhaust mechanism 54 including an adjustment valve 58 and a vacuum pump 56. The exhaust mechanism 54 discharges the gas discharged from the reaction chamber 2 to the outside and adjusts the interior of the reaction chamber 2 to a predetermined pressure.

In addition, in the reaction chamber 2, a cylindrical hot wall (wall surface) 24 that partitions between a film formation region where a film formation process is performed and a side wall (inner wall) 2a of the reaction chamber 2 is provided. The hot wall 24 is made of a material having high heat resistance such as carbon, carbon coated with SiC, or SiC. Incidentally, it is preferable that a cylindrical member (not illustrated) that partitions between the rotator 4 and the side wall (inner wall) 2a is also provided between the rotator 4 and the side wall (inner wall) 2a to prevent film adhesion to the side wall (inner wall) 2a.

A second heater 26 for heating the substrate W from the above is provided between the hot wall 24 and the side wall 2a. The SiC substrate W is mounted below the lower end of the second heater 26. The hot wall 24 is heated by the second heater 26. The second heater 26 is, for example, a resistance heating type heater. In addition, a heat insulating material 20 is provided between the second heater 26 and the side wall 2a, so that the heat from the second heater 26 is prevented from being transmitted to the side wall 2a. By providing the heat insulating material 20, the heater electric power during the heating can be suppressed. The second heater 26 may not be integrated but may be divided and controlled independently.

Incidentally, the hot wall 24 may be inductively heated by a high frequency coil provided outside the hot wall 24.

In the upper portion of the reaction chamber 2, reflector units RU1 and RU2 that reflect radiation from the first heater 14 and the second heater 26 are provided in order to increase thermal efficiency. The reflector unit RU2 is provided below the reflector unit RU1.

The reflector units RU1 and RU2 are configured with a thin plate by using carbon, SiC, or carbon coated with SiC. The reflector units RU1 and RU2 may be configured with a single thin plate, or a plurality of thin plates may be stacked.

A gas supplier 30 is provided in the upper portion of the reaction chamber 2. The gas supplier 30 supplies a process gas such as a purge gas or an SiC source gas to the film formation region through gas flow paths (gas pipes) 32, 34, and 36. For example, an argon gas or a hydrogen gas as a purge gas is supplied onto the substrate W through the gas flow path 32. In addition, a silane gas or a propane gas is supplied as an SiC source gas onto the substrate W through the gas flow paths 34 and 36. Incidentally, in FIG. 2(a), one gas flow path is provided for each gas, but a plurality of gas flow paths may be provided. In addition, the structure of the gas supplier 30 may be a shower head type.

Incidentally, a radiation thermometer (not illustrated) is provided in the upper portion of the reaction chamber 2, so that the temperature of the substrate W can be measured. In this case, a quartz glass window (not illustrated) is provided in a portion of the reaction chamber 2, and the temperature of the substrate W is measured with a radiation thermometer through the quartz glass window.

Figure 2:
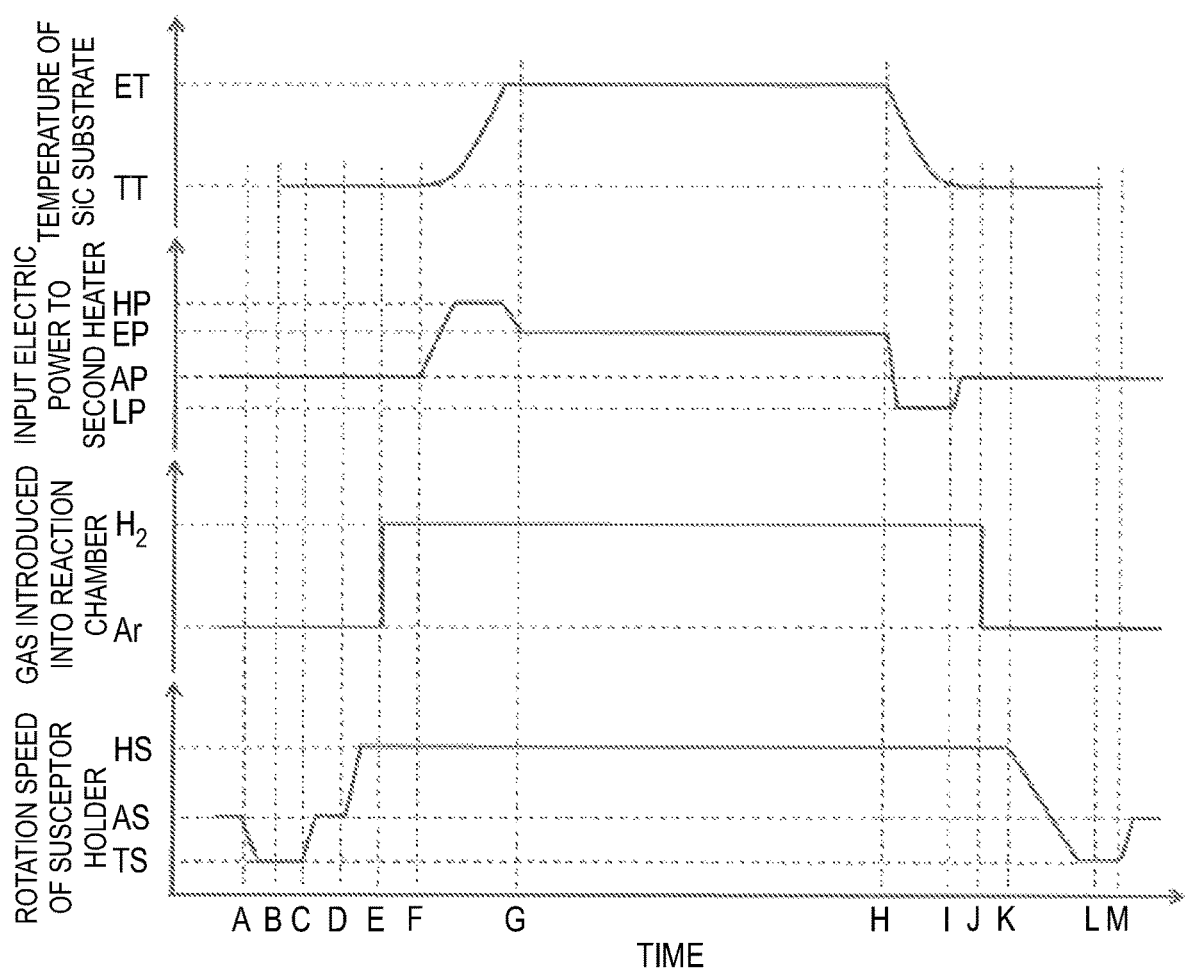
FIG. 2 is a schematic diagram illustrating temporal changes in a temperature of an SiC substrate, an input electric power applied to a second heater, a type of an introduced gas, and a rotation speed of a susceptor holder in the vapor phase growth method according to the embodiment.

FIG. 2 is a schematic diagram illustrating temporal changes in the temperature of the SiC substrate W, the input electric power applied to the second heater 26, the gas introduced into the reaction chamber 2, and the rotation speed of the susceptor holder in the vapor phase growth method according to the embodiment.

In FIG. 2, reference numeral ET denotes the growth temperature of the SiC epitaxial film. Hereinafter, the growth temperature of the SiC epitaxial film is simply referred to as the growth temperature ET. The growth temperature ET is, for example, 1550° C. or higher and 1650° C. or less. Reference numeral TT denotes the loading/unloading temperature of the SiC substrate W. Hereinafter, the loading/unloading temperature of the SiC substrate W is simply referred to as the loading/unloading temperature TT. The loading/unloading temperature TT is, for example, about 1000° C.

In addition, in FIG. 2, reference numeral HP denotes the input electric power applied to the second heater 26 during temperature rise of the SiC substrate W, reference numeral EP denotes the input electric power applied to the second heater 26 during SiC epitaxial growth, reference numeral AP denotes the input electric power applied to the second heater 26, during idling, and reference numeral LP denotes the input electric power applied to the second heater 26 during temperature drop of the SiC substrate W.

In addition, in FIG. 2, the reference numeral HS denotes the rotation speed of the susceptor holder 16 used in the growth of the SiC epitaxial film and is 300 rotation per minute (rpm) or more. Reference numeral AS denotes the rotation speed of the susceptor holder 16 during idling, and reference numeral TS denotes the rotation speed of the susceptor holder 16 during loading or unloading of the SiC substrate W and the susceptor S. In the vapor phase growth method according to the embodiment, the rotation speed denoted by the reference numeral TS is 0 rpm.

Incidentally, the rotation speed of the susceptor holder 16 is equal to the rotation speed of the susceptor S and the rotation speed of the SiC substrate W when the susceptor S and the SiC substrate W are mounted.

In FIG. 2, reference numeral A denotes the time when the rotation speed of the susceptor holder 16 starts to be decreased from AS to TS, reference numeral B denotes the time when the SiC substrate W and susceptor S are loaded, and reference numeral C denotes the time at which the rotation speed of the susceptor holder 16 starts to be increased from TS to AS, and reference numeral D denotes the time at which the rotation speed of the susceptor holder 16 starts to be increased from AS to HS.

In addition, in FIG. 2, reference numeral E denotes the time when the gas introduced into the reaction chamber 2 is changed from the argon gas to the hydrogen gas, reference numeral F denotes the time when the input electric power applied to the second heater 26 starts to be increased to HP, and reference numeral G denotes the time when the SiC epitaxial film starts to be grown, reference numeral H denotes the time when the input electric power applied to the second heater 26 start to be decreased to LP, and reference numeral I denotes the time when the input electric power applied to the second heater 26 starts to be increased to AP.

In addition, in FIG. 2, the reference numeral J denotes the time when the gas introduced into the reaction chamber 2 is changed from the hydrogen gas to the argon gas, the reference numeral K denotes the time when the rotation speed of the susceptor holder 16 starts to be decreased to TS, reference numeral L denotes the time when the SiC substrate W and the susceptor S are unloaded, and the reference numeral M denotes the time when the rotation speed of the susceptor holder 16 starts to be increased to AS.

FIGS. 3A to 3L are a schematic diagram illustrating how downfalls fall in a vapor phase growth apparatus in the vapor phase growth method according to the embodiment. FIG. 4 is a flowchart of the vapor phase growth method according to the embodiment.

First, before mounting the SiC substrate W and the susceptor S on the susceptor holder 16 (before time A of FIG. 2 and in FIG. 3A), that is, in a state where the susceptor S is detached from the susceptor holder 16, the susceptor holder 16 is rotated at a first rotation speed represented by the rotation speed AS of the susceptor holder 16 during idling (S10).

The first rotation speed is 100 rpm or more. In addition, a constant electric power is applied to the first heater 14, and a constant electric power AP is applied to the second heater 26, so that the temperature of the SiC substrate W when the SiC substrate W is loaded becomes about 1000° C. (S12).

At this time, it is preferable that the gas introduced into the reaction chamber 2 is an inert gas in order to operate the apparatus system including the vapor phase growth apparatus 100 safely. Herein, the inert gas is, for example, an argon (Ar) gas or a helium (He) gas. Incidentally, hydrogen ($H_2$) can also be used (S14). In addition, S14 may be performed before S10.

In addition, when the input electric power AP to the second heater 26 changes, the temperature of the hot wall 24 changes. For this reason, the input electric power applied to the second heater 26 is preferably constant at AP.

In addition, when the type of gas introduced into the reaction chamber 2 is changed, since the cooling efficiency of the hot wall 24 is changed, the temperature of the hot wall 24 is changed. For this reason, it is preferable that the type of gas introduced into the reaction chamber 2 is constant and does not change.

Next, at time B of FIG. 2, the rotation speed of the susceptor holder 16 is decreased to TS. In this state, the susceptor S on which the SiC substrate W is mounted is mounted on the susceptor mounting portion 16a of the susceptor holder 16. Herein, the temperature of the SiC substrate W is preferably maintained at TT (SiC substrate loading/unloading temperature). Incidentally, when the temperature of the SiC substrate W before the loading differs from TT, the temperature of the SiC substrate W immediately after the loading also differs from TT, and thus, the temperature of the SiC substrate W reach TT after the elapse of a certain time. However, in FIG. 2, the transient temperature change immediately after the loading of the SiC substrate W is omitted (S16).

Figure 3A:
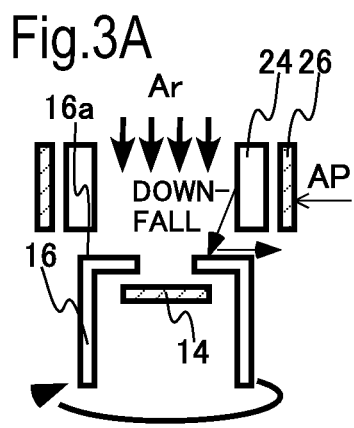
FIGS. 3A to 3L are schematic diagrams illustrating how downfalls fall in a vapor phase growth apparatus in the vapor phase growth method according to the embodiment.
Figure 3B:
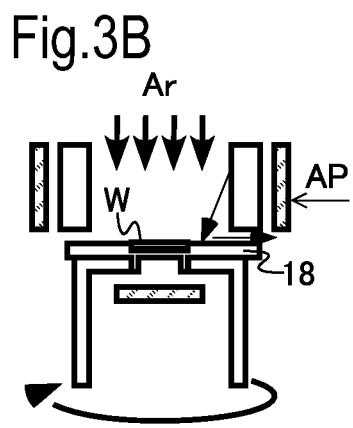
Figure 4:
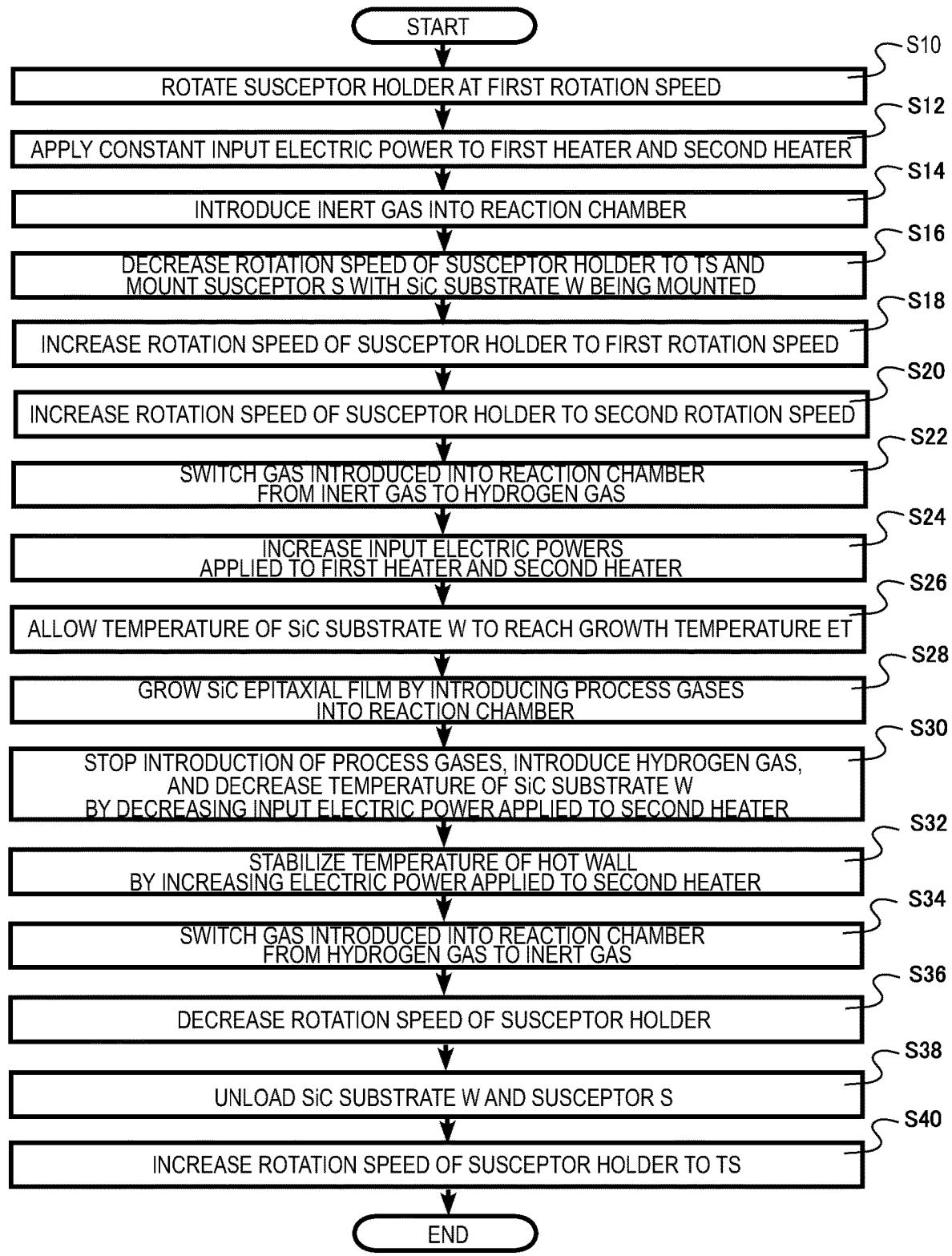
FIG. 4 is a flowchart of the vapor phase growth method according to the embodiment.

Next, at time C of FIG. 2 and in FIG. 3B, the rotation speed of the susceptor holder 16 is increased to the first rotation speed represented by AS, and a deviation of the SiC substrate W and the susceptor S along with the rotation of the susceptor holder 16 is checked (S18).

Figure 3C:
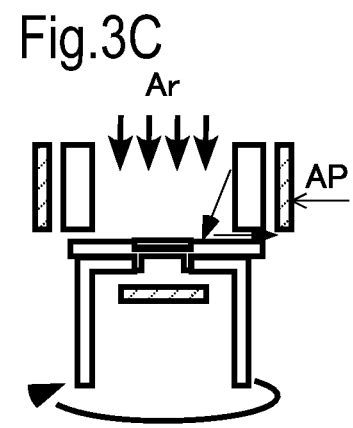

Next, at time D of FIG. 2 and in FIG. 3C, the rotation speed of the susceptor holder 16 is increased to HS (second rotation speed). Incidentally, if it is not necessary to check the deviation, the rotation speed of the susceptor holder 16 may be increased from TS to HS at time C without passing through AS. Herein, HS (second rotation speed) is 300 rpm or more. On the other hand, although the upper limit depends on the apparatus capability, the upper limit may be any rotation speed at which the SiC substrate W can be stably held, and thus, the upper limit may be set to, for example, 2000 rpm. Since such a high rotation speed is used, even if the downfalls fall onto the SiC substrate W, the downfalls can be removed by the centrifugal force. In addition, even small downfalls that cannot be removed by the centrifugal force are easily removed by a high-speed gas flow directed from the center side to the outer peripheral side on the substrate W, which occurs with a high rotation speed (S20).

Figure 3D:
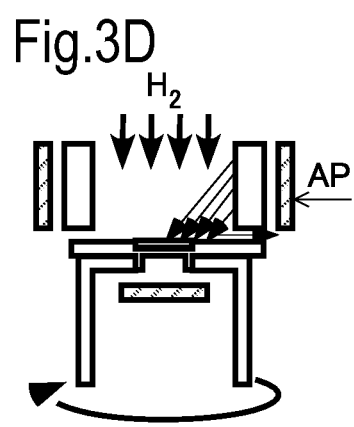

Next, at time E of FIG. 2 and in FIG. 3D, the gas introduced into the reaction chamber 2 is switched from an inert gas (argon gas) to a hydrogen gas used for SiC film formation. The temperature of the SiC substrate at this time is preferably 1300° C. or less (S22).

Figure 3E:
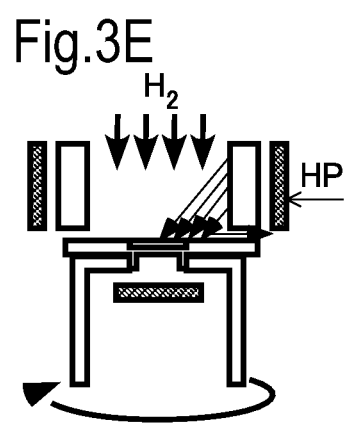

Next, at time F of FIG. 2 and in FIG. 3E, the input electric power applied to the second heater 26 is increased from AP to HP. In addition, the input electric power applied to the first heater 14 is increased. The temperature of the SiC substrate at this time is preferably 1300° C. or less (S24).

In addition, the electric power HP applied to the second heater 26 is preferably larger than the input electric power EP during the growth of the SiC epitaxial film, which will be described later, in order to increase the rate of temperature rise of the SiC substrate W.

Figure 3F:
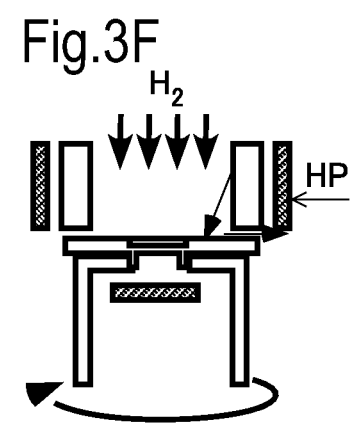

Next, between times F and G of FIG. 2 and in FIG. 3F, the temperature of the SiC substrate W is allowed to further rise, so that the temperature of the SiC substrate W is allowed to reach the growth temperature ET (S26).

Figure 3G:
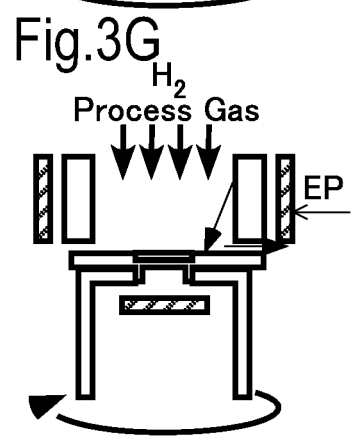

After that, the input electric power applied to the second heater 26 is decreased to EP, and an Si-based gas, a C-based gas, a Cl-based gas for promoting the growth of SiC, and the like together with hydrogen gas as the process gases are introduced into the reaction chamber 2, so that the SiC epitaxial film is grown on the SiC substrate W (time G of FIG. 2 and in FIG. 3G). At this time, the SiC film is deposited on the surface of the hot wall 24. Incidentally, the input electric power applied to the first heater 14 and the second heater 26 may be controlled while measuring the temperature of the SiC substrate W with a pyrometer or the like so that the temperature of the SiC substrate W becomes constant (S28).

Incidentally, the rotation speed during the growth of the SiC epitaxial film may be changed from HS, and the SiC epitaxial film may be grown while rotating, for example, at 100 rpm or more and 2000 rpm or less.

Figure 3H:
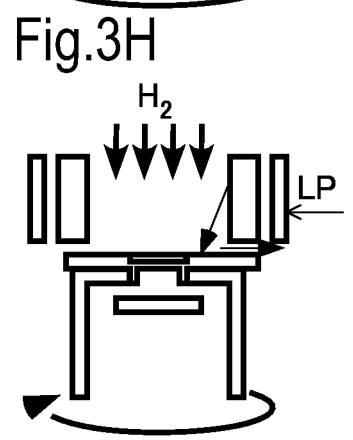

Next, at time H of FIG. 2 and in FIG. 3H, after the introduction of the process gas is stopped and the hydrogen gas is introduced and the growth of the SiC epitaxial film is completed, the input electric power applied to the second heater 26 starts to be decreased to LP. Then, the temperature of the SiC substrate W is decreased to TT. Incidentally, during this period, it is preferable to set the rotation speed of the susceptor holder 16 to HS in order to remove the downfalls by a centrifugal force (S30).

Incidentally, the electric power LP applied to the second heater 26 is not particularly limited, but the electric power LP is preferably lower than the input electric power AP in order to increase the rate of temperature drop of the SiC substrate W. For example, the input electric power LP is preferably zero.

Figure 3I:
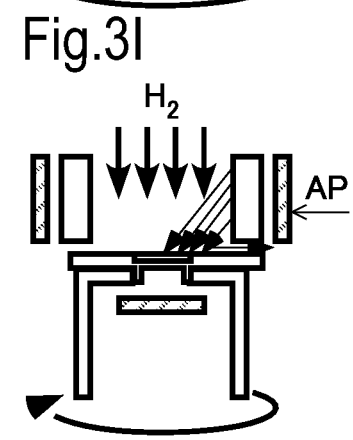

Next, at time I of FIG. 2 and in FIG. 3I, when the temperature of the SiC substrate W approaches TT, the electric power applied to the second heater 26 is increased from LP to AP, and the temperature of the hot wall 24 is stabilized (S32).

Figure 3J:
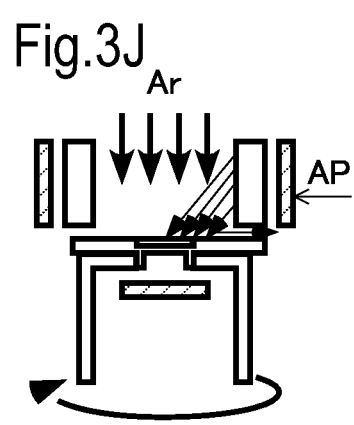

After that, at time J of FIG. 2 and in FIG. 3J, the gas introduced into the reaction chamber 2 is switched from the hydrogen gas to the argon gas (inert gas) (S34).

Figure 3K:
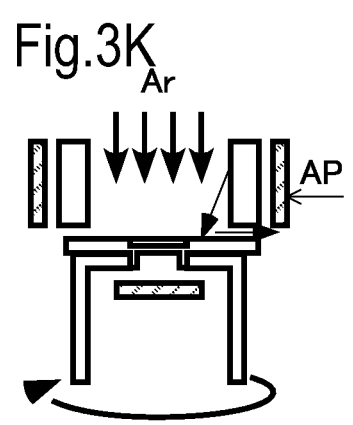

After that, at time K of FIG. 2 and in FIG. 3K, the rotation speed of the susceptor holder 16 is decreased to TS (S36).

Next, at time L of FIG. 2, the SiC substrate W and the susceptor S are unloaded from the inside of the reaction chamber 2 (S38).

Figure 3L:
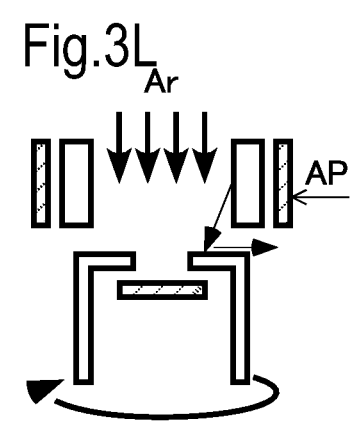

Next, at time M of FIG. 2 and in FIG. 3L, the rotation speed of the susceptor holder 16 is increased to TS (S40).

Next, functions and effects of the vapor phase growth method according to the embodiment will be described.

In general, in a power device using SiC, an SiC epitaxial film having a thickness of 10 μm or more is preferably used. When such a thick SiC epitaxial film is grown, since a large amount of SiC is deposited on the surface of the hot wall 24 by only a few times of growth of the SiC epitaxial film, the occurrence frequency of downfalls is increased. There is a problem in that the downfalls may be device killer defects.

In order to suppress the downfalls, it is preferable to perform maintenance of the vapor phase growth apparatus 100 by frequently opening the reaction chamber 2 to the atmosphere. However, if maintenance is performed frequently, the productivity of the SiC epitaxial film decreases.

It is considered that downfalls are likely to occur particularly when the temperature of the hot wall 24 changes. The temperature of the hot wall 24 is changed in a case where the input electric power applied to the second heater 26 is changed in order to change the temperature of the SiC substrate or in a case where the gas introduced into the reaction chamber is changed from the inert gas to the hydrogen gas or from the hydrogen gas to the inert gas.

In order to grow a high-quality SiC epitaxial film while avoiding frequent maintenance of the vapor phase growth apparatus, it is preferable that, by increasing the occurrence frequency of downfalls intentionally before and after growth of the SiC film, the amount of SiC deposited on the surface of the hot wall is reduced. Furthermore, it is preferable that the downfalls are removed from the SiC substrate even if the downfalls fall onto the SiC substrate.

In the method described at time F of FIG. 2 and in FIG. 3E, since the temperature of the hot wall 24 rises by increasing the electric power applied to the second heater 26 to HP, the temperature of the SiC substrate W rises, and the SiC deposited on the surface of the hot wall 24 is distorted, so that the occurrence frequency of downfalls is increased. Incidentally, after that, when the temperature of the SiC substrate reaches ET in FIG. 3F, even if the electric power applied to the second heater 26 is maintained at HP and the temperature rises, the probability of occurrence of the downfalls are decreased.

In the method described at time E of FIG. 2 and in FIG. 3D, when the gas to be introduced is switched from the inert gas (argon gas) to the hydrogen gas, the temperature of the hot wall 24 is decreased by the hydrogen gas having a higher cooling efficiency. For this reason, since the SiC deposited on the surface of the hot wall 24 is distorted, the occurrence frequency of the downfalls is increased.

At time J of FIG. 2, the temperature is greatly decreased as compared with the time of growing the SiC epitaxial film. For this reason, a large stress is generated in the SiC deposited on the surface of the hot wall 24. In the method described at time J of FIG. 2 and in FIG. 3J, by switching the gas to be introduced from the hydrogen gas to the inert gas (argon gas) having low cooling efficiency, the balance of the stress generated in the SiC deposited on the surface of the hot wall 24 changes abruptly, so that many downfalls occur.

At time I of FIG. 2, the temperature is greatly decreased as compared with the time of growing the SiC epitaxial film. For this reason, a large stress is generated in the SiC deposited on the surface of the hot wall 24. In the method described at time I of FIG. 2 and in FIG. 3I, if the electric power applied to the second heater 26 is increased from LP to AP to stabilize the temperature of the hot wall 24, the balance of the stress generated in the SiC deposited on the surface of the hot wall 24 changes abruptly, so that many downfalls occur. Incidentally, when trying to stabilize the temperature, the temperature of the hot wall 24 may temporarily change from a low temperature to a high temperature.

Since the rotation speed of the SiC substrate is as high as 300 rpm or more, even if the downfalls with the increased occurrence frequency fall onto the SiC substrate W, the downfalls are removed from the SiC substrate W by a centrifugal force. In addition, even small downfalls that cannot be removed by the centrifugal force are easily removed by a high-speed gas flow directed from the center side to the outer peripheral side on the substrate W, which occurs with a high rotation speed. For this reason, it is possible to grow the SiC epitaxial film with high productivity while suppressing the generation of device killer defects.

It is preferable to change the temperature of the hot wall 24 in a state where the temperature of the SiC substrate W is 1300° C. or less. When the temperature of the SiC substrate W exceeds 1300° C., the downfalls may be fixed on the surface of the SiC substrate W.

In addition, it is preferable to rotate the susceptor holder at a first rotation speed of 100 rpm or more in a state where the susceptor S is detached from the susceptor holder. This is the method described before time A of FIG. 2 and in FIG. 3A and at time M of FIG. 2 and in FIG. 3L.

In a case where relatively large downfalls remain on the susceptor mounting portion 16a on the susceptor holder 16, when the SiC substrate W and the susceptor S are mounted on the susceptor holder 16, the downfalls are likely to be interposed between the susceptor mounting portion 16a and the susceptor S. For this reason, it is difficult to rotate the susceptor S and the SiC substrate W on the susceptor S while maintaining the susceptor S and the SiC substrate W horizontal.

By rotating the susceptor holder 16 at the first rotation speed, even if the downfalls fall onto the susceptor mounting portion 16a, relatively large downfalls, that is, downfalls having a volume of, typically, 125000 $\mu m^3$ or more can be easily removed from the susceptor holder 16 by the centrifugal force accompanying the rotation of the susceptor holder 16.

In addition, it is preferable to maintain the temperature of the hot wall 24 constant before mounting the SiC substrate W and the susceptor S on the susceptor holder 16. This is because, due to the change in the temperature of the hot wall 24, the deposited SiC is more likely to be distorted due to the difference between the thermal expansion coefficient of the hot wall 24 and the thermal expansion coefficient of the SiC deposited on the surface of the hot wall 24, and thus, the occurrence frequency of the downfalls are increased.

Heretofore, the embodiments of the invention have been described with reference to specific examples. The above-described embodiments are merely given as examples and do not limit the invention. In addition, the components of the embodiments may be appropriately combined.

For example, in this specification, a case where the SiC film is epitaxially grown mainly on the SiC substrate W has been described. However, other Si substrates and the like can be preferably used.

In the embodiments, description of apparatus configurations, manufacturing methods, and the like that are not directly required for the description of the invention is omitted, but the required apparatus configurations, manufacturing methods, and the like can be appropriately selected and used. In addition, all inspection methods that include elements of the invention and can be appropriately modified in design by those skilled in the art are included within the scope of the invention. The scope of the invention is defined by the scope of the appended claims and the scope of equivalents thereof.

What is claimed is:

1. A vapor phase growth method comprising:
    after SiC is deposited on a wall surface of a reaction chamber, mounting a substrate on a rotator provided in the reaction chamber;
    supplying a first process gas containing no source gas to an upper surface of the substrate from above the substrate and after a rotation speed of the rotator is increased to 300 rpm or more, changing a temperature of the wall surface of the reaction chamber so as to fall downfalls from the wall surface of the reaction chamber to the upper surface of the substrate, the downfalls occurring by peeled off deposited SiC on the wall surface of the reaction chamber, and rotating the substrate at 300 rpm or more so as to remove the downfalls fallen from the upper surface of the substrate while the downfalls falling onto the upper surface of the substrate; and
    after allowing a temperature of the substrate to rise, controlling the substrate to a predetermined film formation temperature and supplying a second process gas containing a source gas to the upper surface of the substrate from above the substrate to grow an SiC film on the substrate.

2. The vapor phase growth method according to claim 1, further comprising;
    after the desired SiC film is grown on the substrate, and the temperature of the substrate is allowed to drop, supplying the first process gas to the upper surface of the substrate from above the substrate and changing the temperature of the wall surface of the reaction chamber, so as to fall downfalls from the wall surface of the reaction chamber to the upper surface of the substrate, the downfalls occurring by peeled off deposited SiC on the wall surface of the reaction chamber, and rotating the substrate at 300 rpm or more so as to remove the downfalls fallen from the upper surface of the substrate while the downfalls falling onto the upper surface of the substrate.

3. The vapor phase growth method according to claim 2, further comprising;
    after the temperature of the substrate is allowed to drop, stabilizing the temperature of the wall surface before changing the temperature of the wall surface.

4. The vapor phase growth method according to claim 1, wherein the temperature of the wall surface is changed by changing the first process gas from an inert gas to a hydrogen gas or from the hydrogen gas to the inert gas while rotating the substrate at 300 rpm or more.

5. The vapor phase growth method according to claim 4, wherein the inert gas is an argon gas or a helium gas.

6. The vapor phase growth method according to claim 1, wherein the temperature of the wall surface is changed in a state where the temperature of the substrate is 1300° C. or less.

7. The vapor phase growth method according to claim 1, wherein the rotator is rotated at 100 rpm or more in a state where the substrate is detached from the rotator.

8. The vapor phase growth method according to claim 1, wherein, after growing the SiC film on the substrate, the substrate is unloaded from the reaction chamber, and the rotation speed of the rotator is increased.

9. The vapor phase growth method according to claim 1, wherein the SiC film is grown on the substrate while rotating the substrate at 100 rpm or more and 2000 rpm or less.

10. The vapor phase growth method according to claim 1, wherein the wall surface is a hot wall provided in the reaction chamber and partitioning between a film formation region with a film formation process being performed and a side wall of the reaction chamber.

* * * * *